(12) United States Patent  (10) Patent No.: US 8,900,723 B2
Seo et al.  (45) Date of Patent: Dec. 2, 2014

(54) ORGANIC LIGHT EMITTING DIODE DISPLAY

(75) Inventors: Sang-Joon Seo, Yongin (KR); Kie Hyun Nam, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 855 days.

(21) Appl. No.: 12/656,101

(22) Filed: Jan. 15, 2010

(65) Prior Publication Data

US 2010/0215929 A1 Aug. 26, 2010

(30) Foreign Application Priority Data

Feb. 26, 2009 (KR) ................. 10-2009-0016495

(51) Int. Cl.
- H01J 1/70 (2006.01)
- B32B 9/00 (2006.01)
- C23C 14/24 (2006.01)
- C23C 16/22 (2006.01)
- H01L 51/52 (2006.01)

(52) U.S. Cl.
CPC .................................. H01L 51/5237 (2013.01)
USPC ............ 428/690; 428/213; 428/446; 428/420

(58) Field of Classification Search
None
See application file for complete search history.

(56) References Cited

U.S. PATENT DOCUMENTS

| 7,459,262 | B2 | 12/2008 | Kim |
| 7,477,012 | B2 | 1/2009 | Su |
| 2001/0031379 | A1 | 10/2001 | Tera et al. |
| 2005/0269951 | A1 | 12/2005 | Handa et al. |
| 2007/0172696 | A1* | 7/2007 | Tong et al. ............... 428/689 |
| 2010/0157585 | A1* | 6/2010 | Diekmann et al. ........... 362/228 |

FOREIGN PATENT DOCUMENTS

| CN | 1265261 | 8/2000 |
| CN | 1333927 | 1/2002 |
| JP | 2001-284042 A | 10/2001 |
| JP | 2002-532847 A | 10/2002 |
| JP | 2007-090803 A | 4/2007 |
| WO | 00/36661 | 6/2000 |
| WO | WO 2008/040323 | * 4/2008 ............. H01L 51/52 |
| WO | 2009/002892 A | 12/2008 |

* cited by examiner

*Primary Examiner* — J. L. Yang
(74) *Attorney, Agent, or Firm* — Robert E. Bushnell, Esq.

(57) ABSTRACT

An organic light emitting diode (OLED) display includes a substrate main body, an OLED formed on the substrate main body, a moisture absorbing layer formed on the substrate main body and covering the OLED, a first barrier layer formed on the substrate main body and covering the moisture absorbing layer, a first auxiliary barrier layer formed between the moisture absorbing layer and the first barrier layer, a second barrier layer formed on the substrate main body and covering the first barrier layer, and a second auxiliary barrier layer formed between the first barrier layer and the second barrier layer.

18 Claims, 4 Drawing Sheets

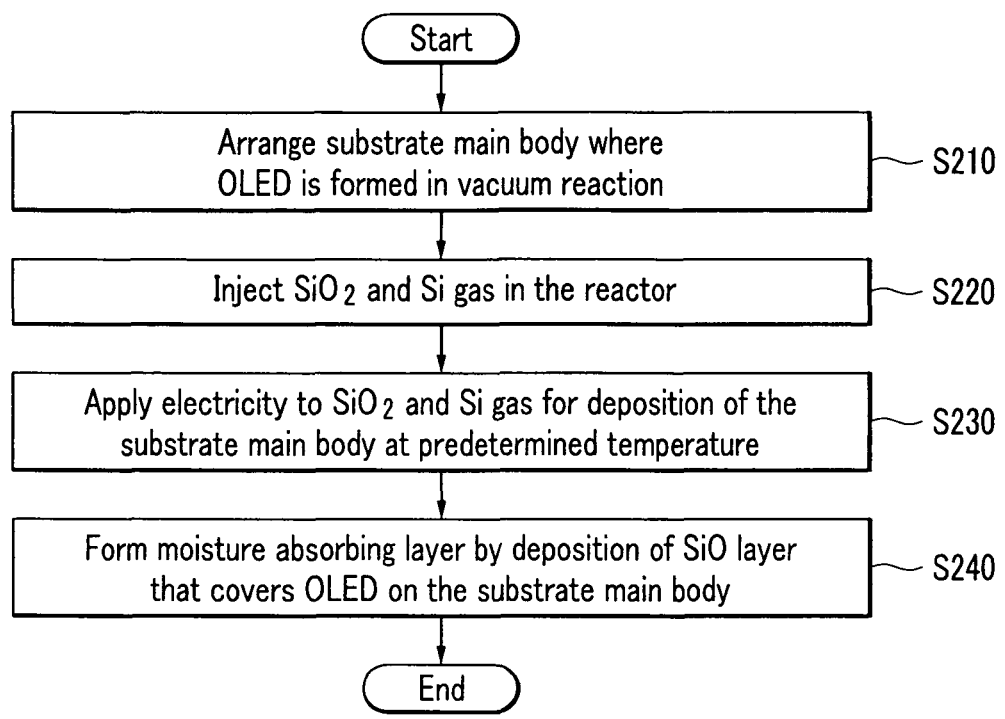

ORGANIC LIGHT EMITTING DIODE DISPLAY

CLAIM OF PRIORITY

This application makes reference to, incorporates the same herein, and claims all benefits accruing under 35 U.S.C. §119 from an application earlier filed in the Korean Intellectual Property Office on 26 Feb. 2009 and there duly assigned Serial No. 10-2009-0016495.

BACKGROUND OF THE INVENTION

1. Field of the Invention

The present invention relates to an organic light emitting diode (OLED) display. More particularly, it relates to a thin film encapsulated OLED display.

2. Description of the Related Art

An OLED display has self-luminance characteristics, and the thickness and weight thereof can be reduced since it does not require a separate light source, unlike a liquid crystal display (LCD). In addition, since the OLED display exhibits high-quality characteristics such as low power consumption, high luminance, high response speed, etc., it is receiving much attention as a next-generation display device.

The OLED display includes a plurality of OLEDs respectively having a hole injection electrode, an organic emission layer, and an electron injection electrode. When the anode and cathode inject holes and electrons into the organic light emitting layer, the OLEDs emit light using energy generated when excitons generated by electron-hole combinations in the organic light emitting layer are dropped from an excited state to a ground state, and an image is displayed when the excitons are dropped from an excited state to a ground state.

However, the organic emission layer is sensitive to external environment factors such as moisture and oxygen so that quality of the OLED display may deteriorate when being exposed to the moisture or oxygen. Therefore, in order to protect the OLEDs and prevent permeation of the moisture and oxygen into the organic emission layer, an encapsulation substrate is sealed to a display substrate where the OLEDs are formed through an additional sealing process, or a thick protection layer is formed on the OLEDs.

However, when the encapsulation substrate is used or the protection layer is formed, the manufacturing process of the OLED display becomes complicated to perfectly prevent permeation of the moisture or oxygen into the organic emission layer and the entire thickness of the OLED display cannot be formed to be slim.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide an OLED display that can effectively suppress permeation of moisture of oxygen into an organic emission layer through a thin film encapsulation layer, and to simultaneously make the entire thickness slim.

In addition, the present invention provides a manufacturing method of an OLED display that can efficiently form the thin film encapsulation layer.

An organic light emitting diode (OLED) display includes a substrate main body, an OLED formed on the substrate main body, a moisture absorbing layer formed on the substrate main body and covering the OLED, a first barrier layer formed on the substrate main body and covering the moisture absorbing layer, a first auxiliary barrier layer formed between the moisture absorbing layer and the first barrier layer, a second barrier layer formed on the substrate main body and covering the first barrier layer, and a second auxiliary barrier layer formed between the first barrier layer and the second barrier layer.

The moisture absorbing layer may be formed of a material including silicon monoxide (SiO), calcium monoxide (CaO), barium monoxide (BaO), or combinations thereof.

The moisture absorbing layer may be formed through a thermal evaporation process. The thermal evaporation process may be performed by using a vacuum evaporation method.

The first barrier layer and the second barrier may be respectively formed of a material including $Al_2O_3$, $TiO_2$, $ZrO$, $SiO_2$, AlON, AlN, SiON, $Si_3N_4$, ZnO, $Ta_2O_5$, or combinations thereof.

Each of the first barrier layer and the second barrier layer may be formed through an atomic layer deposition (ALD) method.

The first barrier layer and the second barrier layer may be formed of materials that are different from each other.

The first auxiliary barrier layer may be formed in an interface between the first barrier layer and the moisture absorbing layer through a reaction therebetween, and may include at least a partial component of the first barrier layer and at least a partial component of the moisture absorbing layer.

The second auxiliary barrier layer may be formed in an interface between the second barrier layer and the first barrier layer through reaction therebetween, and may include at least a partial component of the second barrier layer and at least a partial component of the first barrier layer.

The moisture absorbing layer, the first auxiliary barrier layer, the first barrier layer, the second auxiliary barrier layer, and the second barrier layer may form a thin film encapsulation layer that protects the OLED, and the entire thickness of the thin film encapsulation layer may be in a range of 1 nm to 1000 nm.

A manufacturing method of an OLED display according to the exemplary embodiment of the present invention includes forming an OLED on a substrate main body, forming a moisture absorbing layer that covers the OLED through a thermal evaporation process, forming a first barrier layer that covers the moisture absorbing layer through an atomic layer deposition (ALD) method, forming a first auxiliary barrier layer in an interface between the first barrier layer and the moisture absorbing layer through reaction therebetween, forming a second barrier layer that covers the first barrier layer through the ALD method, and forming a second auxiliary barrier layer in an interface between the second barrier layer and the first barrier layer through reaction therebetween.

The moisture absorbing layer may be formed of a material that includes silicon monoxide (SiO), calcium monoxide (CaO), barium monoxide (BaO), or combinations thereof.

The moisture absorbing layer may be formed through a thermal evaporation process. The thermal evaporation process may include a vacuum evaporation method.

The moisture absorbing layer may be made by deposition of silicon monoxide that is formed from reaction of silicon dioxide ($SiO_2$) and silicon gas.

The first barrier layer and the second barrier layer may be respectively formed of a material that includes $Al_2O_3$, $TiO_2$, ZrO, $SiO_2$, AlON, AlN, SiON, $Si_3N_4$, ZnO, $Ta_2O_5$, or combinations thereof.

The first barrier layer and the second barrier layer are made of materials that are different from each other.

The first auxiliary barrier layer may include at least a partial component of the first barrier layer and at least a partial component of the moisture absorbing layer, and may be made of a material that is different from materials of the first barrier layer and the moisture absorbing layer.

The second auxiliary barrier layer may include at least a partial component of the second barrier layer and at least a partial component of the first barrier layer, and may be made of a material that is different from materials of the second barrier layer and the first barrier layer.

The moisture absorbing layer, the first auxiliary barrier layer, the first barrier layer, the second auxiliary barrier layer, and the second barrier layer may form a thin film encapsulation layer that protects the OLED, and the entire thickness of the thin film encapsulation layer may be in a range of 1 nm to 1000 nm.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein:

FIG. 4 and FIG. 5 are processing flowcharts of a manufacturing process of an OLED display according to an exemplary embodiment of the present invention.

DETAILED DESCRIPTION OF THE EMBODIMENTS

Figure 1:
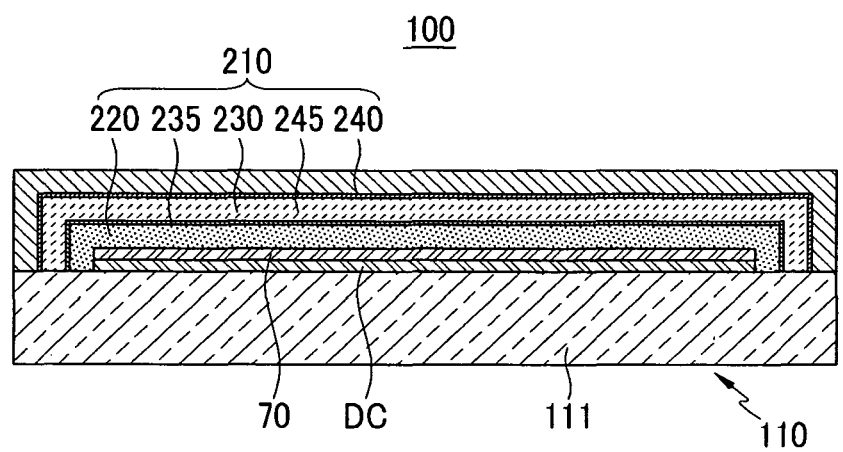
FIG. 1 is a cross-sectional view of an OLED display according to an exemplary embodiment of the present invention.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In order to describe the present invention more clearly, parts that are not related to the description will be omitted from the drawings, and the same symbols will be given to similar parts throughout the specification.

Furthermore, as the size and thickness of the respective structural components shown in the drawings are arbitrarily illustrated for explanatory convenience, the present invention is not necessarily limited to as illustrated.

In the drawings, the thickness of layers, films, panels, regions, etc., are exaggerated for clarity. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Hereinafter, referring to FIG. 1 to FIG. 3, an exemplary embodiment of the present invention will be described.

As shown in FIG. 1, an organic light emitting diode (OLED) display 100 includes a display substrate 110 and a thin film encapsulation layer 210.

The display substrate 110 includes a substrate main body 111, a driving circuit unit DC, and an OLED 70. The driving circuit unit DC and the OLED 70 are formed on the substrate main body 111. The OLED 70 displays an image with an organic emission layer 720 (shown in FIG. 3) that emits light, and the driving circuit unit DC drives the OLED 70. Structures of the OLED 70 and the driving circuit unit DC are not limited to the structures shown in FIG. 1 to FIG. 3, and they may be variously modified within a range that can be easily realized by a person skilled in the art according to a direction of an image display with light emitted from the OLED 70.

The thin film encapsulation layer 210 includes a moisture absorbing layer 220, a first auxiliary barrier layer 235, a first barrier layer 230, a second auxiliary barrier layer 245, and a second barrier layer 240 that are sequentially formed on the substrate main body 111.

The moisture absorbing layer 220 covers the OLED for protection. The moisture absorbing layer 220 is formed of one of silicon monoxide (SiO), calcium monoxide (CaO), and barium monoxide (BaO).

In addition, the moisture absorbing layer 220 is formed through a thermal evaporation process such as a vacuum evaporation method. The thermal evaporation process for forming the moisture absorbing layer 220 may be performed within a range of temperature that does not damage the OLED 70. Therefore, damage to the OLED 70 during the process for forming the moisture absorbing layer 220 can be prevented.

The first barrier layer 230 and the second barrier layer 240 are formed of a material that includes at least one of inorganic insulation materials such as $Al_2O_3$, $TiO_2$, $ZrO$, $SiO_2$, AlON, AlN, SiON, $Si_3N_4$, ZnO, and $Ta_2O_5$. In this case, the first barrier layer 230 and the second barrier layer 240 are formed of materials that are different from each other.

In addition, the first barrier layer 230 and the second barrier layer 240 are formed by deposition of at least one of the above-enumerated inorganic insulation materials through an atomic layer deposition (ALD) method. According to the ALD method, the first and second barrier layers 230 and 240 may be formed by growing the above-enumerated inorganic materials at a temperature below 100 degrees Celsius in order to not damage the OLED 70. The first and second barrier layers 230 and 240 have high density so that permeation of moisture and oxygen can be effectively suppressed.

The first auxiliary barrier layer 235 is formed in an interface between the first barrier layer 230 and the moisture absorbing layer 220. The first auxiliary barrier layer 235 is formed by reaction of the first barrier layer 230 with the moisture absorbing layer 220. That is, the first auxiliary barrier layer 235 is formed by a combination of at least a partial component of the first barrier layer 230 and at least a partial component of the moisture absorbing layer 220. Hereinafter, the at least partial component refers to at least one component or all the components. The first auxiliary barrier layer 235 may be formed through a process for deposition of the first barrier layer 230 on the moisture absorbing layer 220 by using the ALD method, or may be formed after deposition of the first barrier layer 230 on the moisture absorbing layer 220. For example, if the moisture absorbing layer 220 is made of SiO and the first barrier layer 230 is made of $Al_2O_3$, the first auxiliary barrier layer 235 may be made of AlSiOx.

The second auxiliary barrier layer 245 is formed in an interface between the second barrier layer 240 and the first barrier layer 230. The second auxiliary barrier layer 245 is formed by reaction of the second barrier layer 240 with the first barrier layer 230. That is, the second auxiliary barrier layer 245 is formed by a combination of at least a partial component of the second barrier layer 240 and at least a partial component of the first barrier layer 230. The second auxiliary barrier layer 245 may be formed through a process for deposition of the second barrier layer 240 on the first barrier layer 230 by using the ALD method, or may be formed after deposition of the second barrier layer 240 on the first barrier layer 230. For example, if the second barrier layer 240 is made of $TiO_2$ and the first barrier layer 230 is made of $Al_2O_3$, the second auxiliary barrier layer 245 may be made of TiAlOx.

As described, the first auxiliary barrier layer 235, the first barrier layer 230, the second auxiliary barrier layer 245, and the second barrier layer 240 that are sequentially formed on the moisture absorbing layer 220 are respectively formed of different materials with different combination structures. Therefore, the thin film encapsulation layer 210 can more efficiently and stably block moisture or oxygen.

In addition, since the first auxiliary barrier layer 235, the first barrier layer 230, the second auxiliary barrier layer 245, and the second barrier layer 240 are formed through two ALD processes, the entire manufacture process can be relatively easier and damage to the OLED 70 can be minimized.

The entire thickness of the thin film encapsulation layer 210 is within a range of 1 nm to 1000 nm. When the entire thickness of the thin film encapsulation layer 210 is less than 1 nm, it is difficult to stably protect the OLED 70 and prevent permeation of moisture or oxygen. When the entire thickness of the thin film encapsulation layer 210 is greater than 1000 nm, the entire thickness of the OLED display 100 is increased more than necessary. In addition, as the thickness of the first barrier layer 230 and the thickness of the second barrier layer 240 are increased, the entire breathability of the thin film encapsulation layer 210 is significantly decreased. However, when the first barrier layer 230 and the second barrier layer 240 are too thick, a temperature increase may occur during the deposition process so that the OLED 70 may be damaged. In consideration of these characteristics, it is preferred that the entire thickness of the thin film encapsulation layer 210 is within a range of 300 nm to 500 nm.

In addition, the moisture absorbing layer 220 has low moisture permeability so that permeation of moisture or oxygen can be blocked. However, components that are additionally used as the moisture absorbing layer 220 combine with the moisture or oxygen and suppress permeation of the moisture or oxygen into the OLED. That is, silicon monoxide (SiO), calcium monoxide (CaO), and barium monoxide (BaO) used as the material of the moisture absorbing layer 220 strongly tend to become dioxides through combination with oxygen atoms, and therefore the moisture absorbing layer 220 is combined with a minimum amount of moisture or oxygen that has been sequentially passed through the second barrier layer 240, the second auxiliary barrier layer 245, the first barrier layer 230, and the first auxiliary barrier layer 235 so that permeation of the moisture or oxygen into the OLED 70 can be effectively blocked.

With the above-described configuration, the thin film encapsulation layer 210 of the OLED display 100 according to the exemplary embodiment of the present invention has a water vapor transmission rate (WWTR) of less then $10^{-6}$ $g/m^2/day$.

Therefore, the OLED display 100 can stably and efficiently suppress permeation of moisture or oxygen to the organic emission layer 720 (shown in FIG. 3) and can simultaneously allow the overall thickness of the OLED display 100 to be slim.

In addition, since the moisture absorbing layer 220 is relatively softer than the first auxiliary barrier layer 235, the first barrier layer 230, the second auxiliary barrier layer 245, and the second barrier layer 240, it also eases stress or impact transmitted to the OLED 70. As an OLED display 100 is bent, stress may occur between the first auxiliary barrier layer 235, the first barrier layer 230, the second auxiliary barrier layer 245, and the second barrier layer 240. Due to the stress, the thin film encapsulation layer 210 may be damaged so that the moisture permeation blocking function may significantly deteriorate. In addition, the stress is transmitted to the OLED 70, thereby causing a failure of the OLED 70. But as described, the moisture absorbing layer 220 can suppress moisture permeation and ease generation of stress, and can reduce impact transmitted to the OLED 70.

Hereinafter, an internal structure of the OLED display 100 will be described in further detail with reference to FIG. 2 and FIG. 3.

Figure 2:
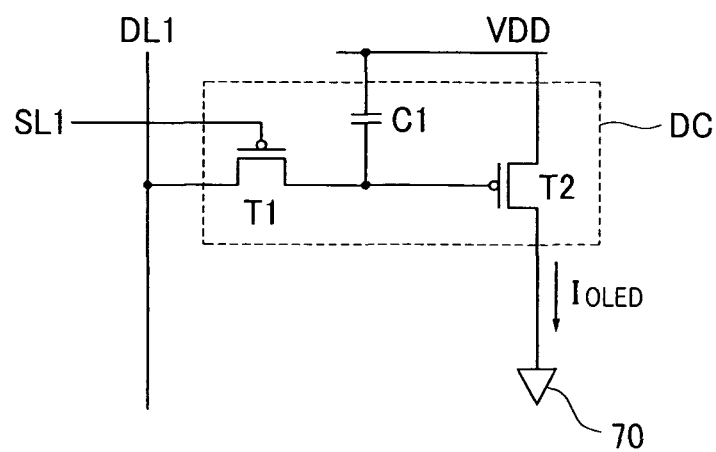
FIG. 2 is a layout view of a pixel circuit of the OLED display of FIG. 1.
Figure 3:
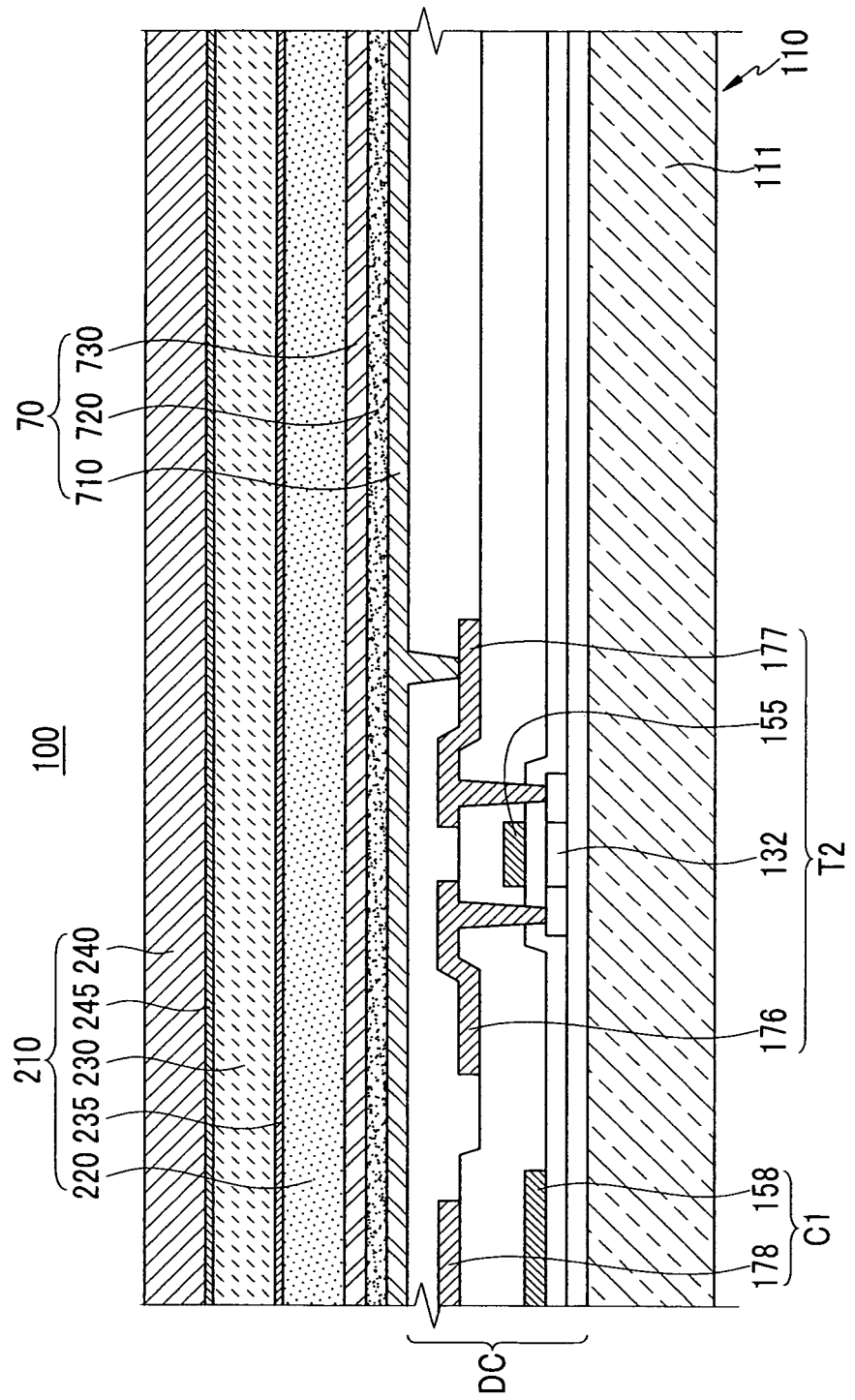
FIG. 3 is a partially enlarged cross-sectional view of the OLED of FIG. 1.

As shown in FIG. 2 and FIG. 3, the OLED 70 includes a first electrode 710, an organic emission layer 720, and a second electrode 730. The driving circuit unit DC includes at least two thin film transistors (TFTs) T1 and T2 and at least one storage capacitor C1. The TFT basically includes a switching transistor T1 and a driving transistor T2.

The switching transistor T1 is connected to a scan line SL1 and a data line DL1, and transmits, depending on a switching voltage input to the scan line SL1, a data voltage input from the data line DL1 to the driving transistor T2. The storage capacitor C1 is connected to the switching transistor T1 and the power source line VDD, and stores a voltage difference between a voltage supplied from the switching transistor T1 and a voltage supplied to the power source line VDD.

The OLED 70 emits light by an output current $I_{OLED}$. The driving transistor T2 includes a semiconductor layer 132, a source electrode 176, a drain electrode 177, and a gate electrode 155, and the first electrode 710 of the OLED 70 is connected to the drain electrode 177 of the driving transistor T2.

The storage capacitor C1 may be formed of a first capacitor plate 158 formed on the same layer where the gate electrode 155 is formed, and a second capacitor plate 178 formed on the same layer where the source electrode 176 and the drain electrode 177 are formed. However, the exemplary embodiment of the present invention is not limited thereto. Therefore, one of the capacitor plates 158 and 178 may be formed on the same layer where the semiconductor layer 132 is formed, and the structure of the storage capacitor C1 may be variously modified within a range that can be easily realized by a person skilled in the art.

In addition, in FIG. 2 and FIG. 3, the OLED display 100 is illustrated as an active matrix (AM)-type OLED display in a two-transistors-and-one-capacitor structure in which two TFTs T1 and T2 and one storage capacitor C1 are formed in one pixel, but the exemplary embodiment of the present invention is not limited thereto. Therefore, the OLED display 100 can have various structures. For example, three or more TFTs and two or more capacitors can be provided in one pixel of the OLED display 100, and separate wires can be further provided in the OLED display 100. Here, a pixel is a minimum unit for displaying an image, and the OLED display 100 displays an image by using a plurality of pixels.

Hereinafter, referring to FIG. 1, FIG. 4, and FIG. 5, a manufacturing method of the OLED display 100 according to the exemplary embodiment of the present invention will be described, focusing on a process for forming the thin film encapsulation layer 210.

Figure 4:
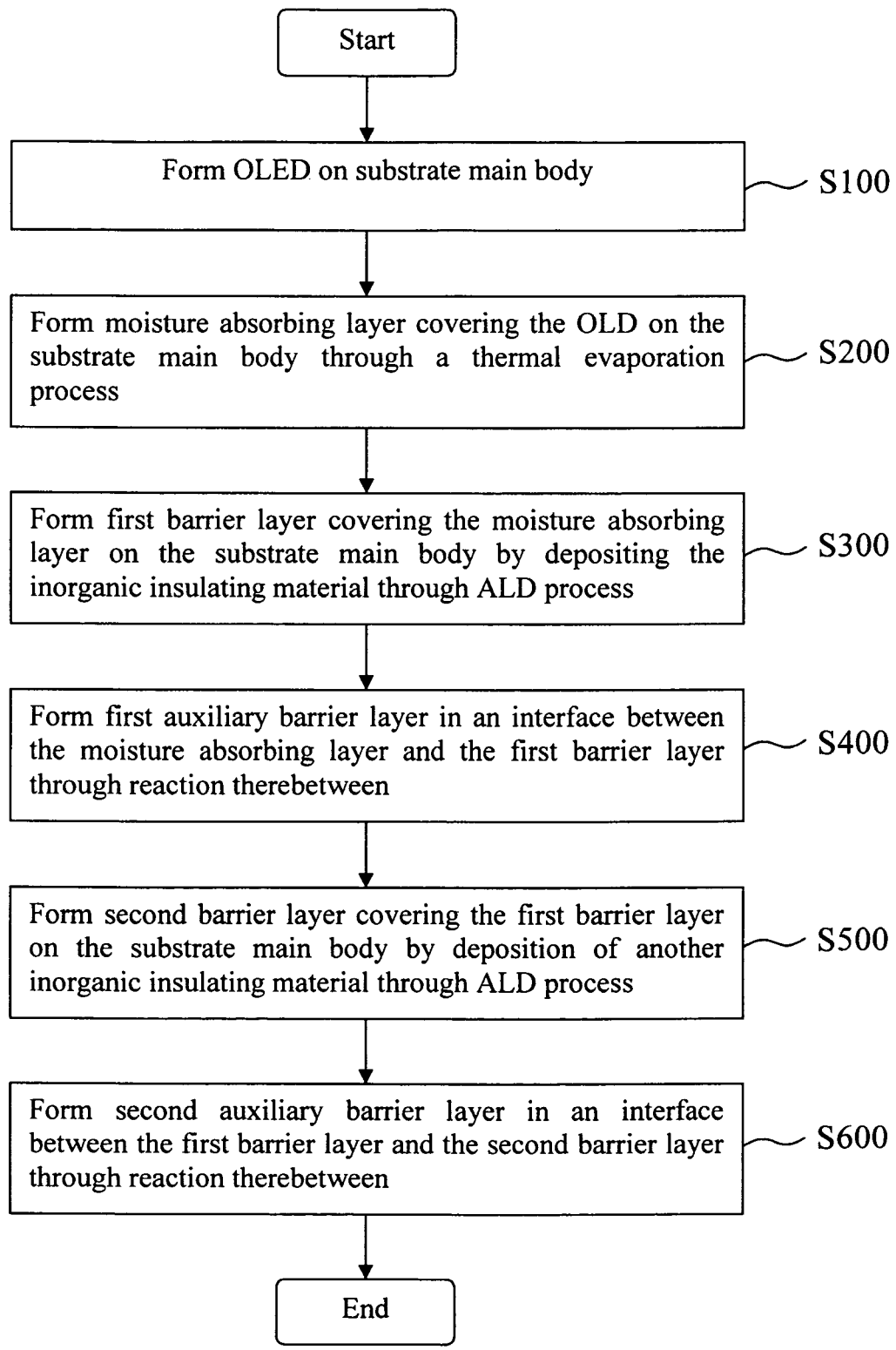

As shown in FIG. 1 and FIG. 4, the OLED 70 is first formed on the substrate main body 111 (S100). Next, the moisture absorbing layer 220 covering the OLD 70 is formed on the substrate main body 111 through a thermal evaporation process (S200). In this case, a vacuum evaporation method is used as the thermal evaporation process. In addition, the moisture absorbing layer 220 is made of one of silicon monoxide (SiO), calcium monoxide (CaO), and barium monoxide (BaO).

Referring to FIG. 5, the process for forming the moisture absorbing layer 220 will be described in further detail. In the following description, the moisture absorbing layer 220 is made of, for example, silicon monoxide (SiO).

The substrate main body 111 where the OLED 70 is formed is disposed on a vacuum reactor (S210). Silicon dioxide ($SiO_2$) and silicon (Si) gas are injected into the reactor (S220), and electricity is applied to the silicon dioxide ($SiO_2$) and silicon (Si) gas to start deposition of the substrate main body 111 at a predetermined temperature (S230). Here, the predetermined temperature is included within a range that does not damage the OLED 70. The silicon dioxide and silicon gas react with each other so that silicon monoxide SiO is formed, and the silicon monoxide SiO is deposited on the substrate main body 111 so that the moisture absorbing layer 220 covering the OLED 70 is formed (S240). For example, in this case, the deposition speed is 3 Å/sec, and the reactor is evacuated to a degree of vacuum of about $10^{-7}$ torr.

Referring back to FIG. 4, the first barrier layer 230 that covers the moisture absorbing layer 220 is formed on the substrate main body 111 by depositing the inorganic insulating material through the atomic layer deposition (ALD) process (S300). Here, when forming the first barrier layer 230 through the ALD process, the inorganic insulating material is grown at a temperature below 100 degrees Celsius to prevent damage to the OLED 70. The inorganic insulating material includes at least one of $Al_2O_3$, $TiO_2$, ZrO, $SiO_2$, AlON, AlN, SiON, $Si_3N_4$, ZnO, and $Ta_2O_5$. Hereinafter, the first barrier layer 230 will be described to be made of, for example, $Al_2O_3$.

Once the first barrier layer 230 is formed on the moisture absorbing layer 220 through the ALD process, the first barrier layer 230 reacts with the moisture absorbing layer 220 during or after the forming of the first barrier layer 230 so that the first auxiliary barrier layer 235 is additionally formed in an interface between the first barrier layer 230 and the moisture absorbing layer 220 (S400). In this case, if the moisture absorbing layer 220 is made of SiO and the first barrier layer 230 is made of $Al_2O_3$, the first auxiliary barrier layer 235 is formed of AlSiOx.

Next, the second barrier layer 240 that covers the first barrier layer 230 is formed on the substrate main body 111 by deposition of another inorganic insulating material through the ALD process (S500). Here, when forming the second barrier layer 240 through the ALD process, the other inorganic insulating material is grown at a temperature below 100 degrees Celsius to prevent damage to the OLED 70. Hereinafter, the second barrier layer 240 will be described to be made of, for example, $TiO_2$.

Once the second barrier layer 240 is formed on the first barrier layer 230 through the ALD process, the second barrier layer 240 reacts with the first barrier layer 230 during or after the forming of the second barrier layer 24 so that the second auxiliary barrier layer 245 is formed in an interface between the first barrier layer 230 and the second barrier layer 240 (S600). In this case, if the first barrier layer 230 is made of $Al_2O_3$ and the second barrier layer 240 is made of $TiO_2$, the second auxiliary barrier layer 245 is formed of TiAlOx.

The thin film encapsulation layer 210 formed through the above-described process has a thickness of a range between 1 nm to 1000 nm. Here, it is the most preferable thickness of the thin film encapsulation layer 210 is included within a range of 300 nm to 500 nm.

The thin film encapsulation layer 210 that can stably and effectively suppress permeation of moisture or oxygen into the organic emission layer 720 can be easily and efficiently formed through the above-described manufacturing method.

In addition, the entire thickness of the OLED display 100 can be relatively slim.

According to the present invention, the OLED display can effectively suppress permeation of moisture of oxygen into the organic emission layer through the thin film encapsulation layer and can simultaneously allow the entire thickness of the OLED display to be slim.

In addition, the present invention provides a manufacturing method of the OLED display that can simply and efficiently form a thin film encapsulation layer.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode (OLED) display device, comprising:
   a substrate main body;
   an OLED formed on the substrate main body; and
   a thin film encapsulation layer consisting of
      a moisture absorbing layer formed on the substrate main body and covering the OLED;
      a first barrier layer formed on the substrate main body and covering the moisture absorbing layer;
      a first auxiliary barrier layer formed between the moisture absorbing layer and the first barrier layer;
      a second barrier layer formed on the substrate main body and covering the first barrier layer; and
      a second auxiliary barrier layer formed between the first barrier layer and the second barrier layer, materials of the moisture absorbing layer, the first barrier layer, the first auxiliary barrier layer, the second barrier layer, and the second auxiliary barrier layer being different from each other.

2. The OLED display device of claim 1, wherein the moisture absorbing layer is formed of a material including one selected from the group consisting of silicon monoxide (SiO), calcium monoxide (CaO), barium monoxide (BaO), and combinations thereof.

3. The OLED display device of claim 2, wherein the moisture absorbing layer is formed through a thermal evaporation process.

4. The OLED display device of claim 3, wherein the thermal evaporation process is performed by using a vacuum evaporation method.

5. The OLED display device of claim 1, wherein each of the first barrier layer and the second barrier layer is formed of a material including one selected from the group consisting of $Al_2O_3$, $TiO_2$, ZrO, $SiO_2$, AlON, AN, SiON, $Si_3N_4$, ZnO, $Ta_2O_5$, and combinations thereof.

6. The OLED display device of claim 5, wherein each of the first barrier layer and the second barrier layer is formed through an atomic layer deposition (ALD) method.

7. The OLED display device of claim 1, wherein the first auxiliary barrier layer is formed in an interface between the first barrier layer and the moisture absorbing layer through reaction therebetween, and includes at least a partial component of the first barrier layer and at least a partial component of the moisture absorbing layer.

8. The OLED display device of claim 1, wherein the second auxiliary barrier layer is formed in an interface between the second barrier layer and the first barrier layer through reaction therebetween, and includes at least a partial component of the second barrier layer and at least a partial component of the first barrier layer.

9. The OLED display device of claim 1, wherein the moisture absorbing layer, the first auxiliary barrier layer, the first barrier layer, the second auxiliary barrier layer, and the second barrier layer form a thin film encapsulation layer that protects the OLED, and the entire thickness of the thin film encapsulation layer is in a range of 1 nm to 1000 nm.

10. A manufacturing method of an organic light emitting diode (OLED) display device, comprising:
forming an OLED on a substrate main body;
forming a moisture absorbing layer that covers the OLED through a thermal evaporation process to form a thin film encapsulation layer;
forming a first barrier layer that covers the moisture absorbing layer through an atomic layer deposition (ALD) method to form the thin film encapsulation layer;
forming a first auxiliary barrier layer in an interface between the first barrier layer and the moisture absorbing layer through reaction therebetween to form the thin film encapsulation layer;
forming a second barrier layer that covers the first barrier layer through the ALD method to form the thin film encapsulation layer; and
forming a second auxiliary barrier layer in an interface between the second barrier layer and the first barrier layer through reaction therebetween to form the thin film encapsulation layer, materials of the moisture absorbing layer, the first barrier layer, the first auxiliary barrier layer, the second barrier layer, and the second auxiliary barrier layer being different from each other, the thin film encapsulation layer consisting of the moisture absorbing layer, the first barrier layer, the first auxiliary barrier layer, the second barrier layer and the second auxiliary barrier layer.

11. The manufacturing method of claim 10, wherein the moisture absorbing layer is formed of a material including one selected from the group consisting of silicon monoxide (SiO), calcium monoxide (CaO), barium monoxide (BaO), and combinations thereof.

12. The manufacturing method of claim 11, wherein the moisture absorbing layer is formed through a thermal evaporation process.

13. The manufacturing method of claim 12, wherein the thermal evaporation process includes a vacuum evaporation method.

14. The manufacturing method of claim 13, wherein the moisture absorbing layer is made by deposition of silicon monoxide that is formed from reaction of silicon dioxide ($SiO_2$) and silicon gas.

15. The manufacturing method of claim 10, wherein each of the first barrier layer and the second barrier layer is formed of a material including one selected from the group consisting of $Al_2O_3$, $TiO_2$, ZrO, $SiO_2$, AlON, AN, SiON, $Si_3N_4$, ZnO, $Ta_2O_5$, and combinations thereof.

16. The manufacturing method of claim 10, wherein the first auxiliary barrier layer includes at least a partial component of the first barrier layer and at least a partial component of the moisture absorbing layer, and is made of a material that is different from materials of the first barrier layer and the moisture absorbing layer.

17. The manufacturing method of claim 10, wherein the second auxiliary barrier layer includes at least a partial component of the second barrier layer and at least a partial component of the first barrier layer, and is made of a material that is different from materials of the second barrier layer and the first barrier layer.

18. The manufacturing method of claim 10, wherein the moisture absorbing layer, the first auxiliary barrier layer, the first barrier layer, the second auxiliary barrier layer, and the second barrier layer form a thin film encapsulation layer that protects the OLED, and the entire thickness of the thin film encapsulation layer is in a range of 1 nm to 1000 nm.

* * * * *